(12) United States Patent
Nakada et al.

(10) Patent No.: US 10,239,211 B2
(45) Date of Patent: Mar. 26, 2019

(54) CARRYING METHOD AND BONDING APPARATUS

(71) Applicant: Tokyo Ohka Kogyo Co., Ltd., Kawasaki-shi (JP)

(72) Inventors: Kimihiro Nakada, Kawasaki (JP); Shigeru Kato, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 568 days.

(21) Appl. No.: 14/945,959

(22) Filed: Nov. 19, 2015

(65) Prior Publication Data

US 2016/0158939 A1 Jun. 9, 2016

(30) Foreign Application Priority Data

Dec. 3, 2014 (JP) ................. 2014-245407

(51) Int. Cl.
| | |
|---|---|
| *H01L 21/677* | (2006.01) |
| *B25J 9/16* | (2006.01) |
| *H01L 21/683* | (2006.01) |
| *H01L 21/687* | (2006.01) |
| *B32B 38/18* | (2006.01) |

(Continued)

(52) U.S. Cl.
CPC ......... *B25J 9/1682* (2013.01); *B32B 38/1841* (2013.01); *B32B 41/00* (2013.01); *H01L 21/67742* (2013.01); *H01L 21/67748* (2013.01); *H01L 21/6835* (2013.01); *H01L 21/68742* (2013.01); *B32B 37/003* (2013.01); *B32B 37/0046* (2013.01); *B32B 37/06* (2013.01); *B32B 37/10* (2013.01); *B32B 2038/1891* (2013.01); *B32B 2309/02* (2013.01); *B32B 2309/68* (2013.01); *B32B 2457/14* (2013.01); *G05B 2219/39117* (2013.01); *G05B 2219/39121* (2013.01); *H01L 2221/68327* (2013.01); *Y10S 901/08* (2013.01)

(58) Field of Classification Search
CPC .............. B25J 9/1682; H01L 21/67742; H01L 21/67748
See application file for complete search history.

(56) References Cited

U.S. PATENT DOCUMENTS

| | | | | |
|---|---|---|---|---|
| 6,116,848 | A | * | 9/2000 | Thomas ................. H01L 21/68 414/754 |
| 6,276,731 | B1 | * | 8/2001 | Hino ................. H01L 21/68707 294/213 |

(Continued)

FOREIGN PATENT DOCUMENTS

| | | |
|---|---|---|
| JP | 2008-182127 | 8/2008 |
| JP | 2009-212196 | 9/2009 |

(Continued)

OTHER PUBLICATIONS

Machine Translation of Japanese Patent 2012-59758, Date Unknown.*

(Continued)

*Primary Examiner* — Jeffrey H Aftergut
(74) *Attorney, Agent, or Firm* — Knobbe Martens Olson & Bear LLP (57) ABSTRACT

A laminate is directly transferred from a first robot arm that carries the laminate from a bonding chamber to an overlapping chamber, to a second robot arm that carries out the laminate from the overlapping chamber to the outside.

4 Claims, 9 Drawing Sheets

(51) Int. Cl.
  *B32B 41/00*  (2006.01)
  *B32B 37/06*  (2006.01)
  *B32B 37/10*  (2006.01)
  *B32B 37/00*  (2006.01)

(56) References Cited

U.S. PATENT DOCUMENTS

| | | | |
|---|---|---|---|
| 9,911,637 B2 * | 3/2018 | Katsuragawa | ........ H01L 21/681 |
| 2009/0218460 A1 | 9/2009 | Nakamura et al. | |
| 2011/0076117 A1 | 3/2011 | Iizuka | |
| 2011/0214809 A1 * | 9/2011 | Sugiyama | ............... B32B 37/10 |
| | | | 156/285 |
| 2016/0005635 A1 | 1/2016 | Inao et al. | |

FOREIGN PATENT DOCUMENTS

| | | |
|---|---|---|
| JP | 2012-59758 | 3/2012 |
| JP | 2012-059758 A  * | 3/2012 |
| JP | 2013-055363 | 3/2013 |
| JP | 2013-243226 | 12/2013 |
| TW | 201130074 | 9/2011 |
| WO | WO 2014/157082 | 10/2014 |

OTHER PUBLICATIONS

Office Action in Japanese Patent Application No. 2014-245407, dated Apr. 10, 2018.
Office Action issued in Taiwanese Patent Application No. 104138305, dated Oct. 2, 2018.

* cited by examiner

CARRYING METHOD AND BONDING APPARATUS

CROSS-REFERENCE TO RELATED APPLICATIONS

Priority is claimed on Japanese Patent Application No. 2014-245407, filed Dec. 3, 2014, the content of which is incorporated herein by reference.

BACKGROUND OF THE INVENTION

Field of the Invention

The present invention relates to a bonding apparatus that bonds a substrate and a support and a carrying method in the bonding apparatus.

Background Art

As functions of cellular phones, digital AV apparatuses, and IC cards become more advanced, there is an increasing demand for mounted semiconductor silicon chips (hereinafter, referred to as chips) to be smaller and thinner so as to highly integrate the chips in a package. In order to realize the high integration of chips in a package, the thickness of a chip is required to be thin to a range of 25 µm to 150 µm.

However, when a semiconductor wafer (hereinafter, referred to as a wafer) that becomes a base of a chip is thinned by being grinded, the strength thereof is weakened, and the wafer is easily cracked or warped. In addition, since it is difficult for the wafer of which strength is weakened by being thinned to be automatically carried, the wafer has to be carried by hand, and thus handling thereof is cumbersome.

Therefore, there has been developed a wafer support system in which a plate which is called a support plate and formed of glass or rigid plastic is bonded to a wafer to be grinded, so as to maintain the strength of the wafer and prevent the generation of cracking and warping of the wafer. In the wafer support system, the strength of the wafer can be maintained, and thus the carrying of the thinned semiconductor wafer can be automated.

The wafer and the support plate is bonded by using an adhesive tape, a thermoplastic resin, and an adhesive agent. After the wafer to which a support plate is bonded is thinned and before the wafer is diced, the support plate is separated from the substrate.

As means for bonding a support plate to a wafer, a bonding apparatus including an overlapping unit that overlaps a wafer and a support plate in a predetermined position before the wafer and the support plate are bonded is disclosed in JP-A-2008-182127 (published on Aug. 7, 2008). In addition, a bonding apparatus including a decompressable first process chamber that has position matching means for performing position matching between the substrate and the support before the substrate and the support are bonded, and a decompressable second process chamber including bonding means for bonding the substrate and the support which are subjected to the position matching, in which the first process chamber and the second process chamber are formed such that at least one set of the substrate and the support which is subjected to the position matching can be moved from the first process chamber to the second process chamber under decompression is disclosed in JP-A-2012-59758 (published on Mar. 22, 2012).

SUMMARY OF THE INVENTION

In order to further improve the apparatuses of JP-A-2008-182127 and JP-A-2012-59758, the present inventors have diligently reviewed a bonding apparatus including an overlapping chamber (corresponding to the first process chamber) in which overlapping between a substrate and a support is performed and a bonding chamber (corresponding to the second process chamber) in which bonding between the substrate and the support which are overlapped is performed, and have uniquely found that the following problems may occur under certain conditions.

That is, according to this bonding apparatus, generally, in order to maintain an environment in a bonding chamber, a laminate of a substrate and a support bonded in a bonding chamber is carried to an overlapping chamber and carried out. At this point, the laminate is temporarily mounted on a predetermined portion in the overlapping chamber, but the laminate after bonding is hot in many cases, and thus the predetermined portion may be heated.

Also, when a support for performing new overlapping is carried in an overlapping chamber, depending on a process, a support having an adhesive layer formed on the lower surface may be mounted on the predetermined portion. In this case, if the predetermined portion is heated, the adhesive layer may be softened and adhered to the predetermined portion.

The invention has been made in view of the problems described above and a main object thereof is to provide a technique for preventing unintended softening of an adhesive layer for bonding a substrate and a support in a bonding apparatus that bonds a substrate and a support.

In order to solve the problem described above, a carrying method according to the invention includes a first carrying step of carrying a substrate and a support which are overlapped from an overlapping chamber in which overlapping between the substrate and the support is performed, to a bonding chamber in which bonding between the substrate and the support is performed by a first robot arm; a second carrying step of carrying a bonded laminate from the bonding chamber to the overlapping chamber by the first robot arm; a transferring step of directly transferring the laminate carried to the overlapping chamber, from the first robot arm to a second robot arm; and a carrying-out step of carrying-out the laminate transferred to the second robot arm, from the overlapping chamber to the outside.

In addition, the bonding apparatus according to the invention includes an overlapping chamber in which overlapping between a substrate and a support is performed; a bonding chamber in which bonding between the substrate and the support which are overlapped is performed to obtain a laminate; a first robot arm that carries the substrate and the support which are overlapped to the bonding chamber from the overlapping chamber and carries the laminate from the bonding chamber to the overlapping chamber; and a second robot arm to which the laminate carried to the overlapping chamber is directly transferred from the first robot arm and which transfers out the laminate to the outside from the overlapping chamber.

According to the invention, it is possible to prevent unintended softening of an adhesive layer for bonding a substrate and a support by directly transferring a laminate from a first robot arm that carries the laminate from a bonding chamber to an overlapping chamber to a second robot arm that carries out the laminate from the overlapping chamber to the outside such that the predetermined portion is prevented from being heated in the bonding chamber.

DETAILED DESCRIPTION OF THE INVENTION

An embodiment of a bonding apparatus and a carrying method according to the invention is described below with reference to FIGS. 1 to 15 and 18.

1. Bonding Apparatus

The bonding apparatus according to the invention includes an overlapping chamber in which overlapping is performed between a substrate and a support, a bonding chamber in which the substrate and the support which are overlapped to each other are bonded so as to obtain a laminate, a first robot arm that carries the substrate and the support which are overlapped to each other from the overlapping chamber to the bonding chamber and carries the laminate from the bonding chamber to the overlapping chamber, and a second robot arm to which the laminate carried to the overlapping chamber is directly transferred from the first robot arm and which carries out the laminate from the overlapping chamber to the outside.

According to the embodiment, a process of temporarily bonding a wafer (substrate) 42 to a support plate (support) 41 is exemplified. That is, the support plate 41 is provided for supporting the wafer 42 in order to prevent damage or deformation of the wafer 42 at the time of performing processes for thinning, carrying, and mounting the wafer 42. For example, the support plate 41 is made of glass or silicon. In addition, a functional layer such as a release layer altered by light may be formed on the surface that is joined to the wafer 42 of the support plate 41. In addition, in this specification, a laminate in which the support plate 41 and the wafer 42 are overlapped on each other, regardless of whether the overlapping is performed before or after the main joining is referred to as a support plate laminated wafer 40.

Figure 2:
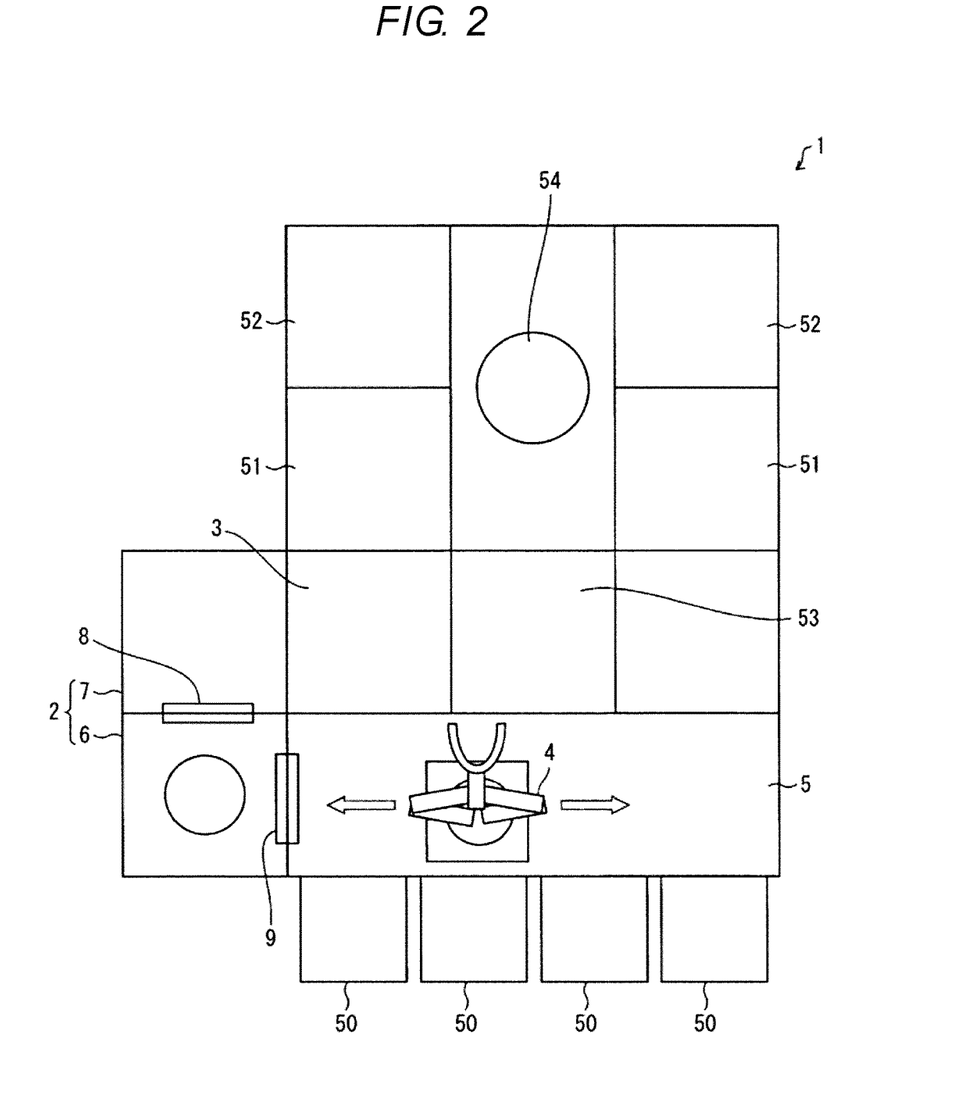
FIG. 2 is a diagram illustrating a configuration of an entire system including the bonding apparatus according to the embodiment of the invention.

FIG. 2 is a diagram illustrating a configuration of the entirety of a system 1 including a bonding apparatus 2 according to the embodiment, and a schematic view seen from right above the system 1. As illustrated in FIG. 2, the system 1 includes the bonding apparatus 2, a prealigner 3, an external robot arm (second robot arm) 4, and an external robot arm track 5. In FIG. 2, FOUP openers 50 included in the system 1, spinners 52 that coat an adhesive layer on the support plate 41, baking plates 51 that cure the coated adhesive layer, an external robot arm 54, and a path line 53 for delivering the support plate 41 to the external robot arm 4 are further illustrated.

The bonding apparatus 2 includes a load lock chamber (overlapping chamber) 6 and a joining chamber (bonding chamber) 7. Though the invention is not limited thereto, the load lock chamber 6 and the joining chamber 7 have, for example, a structure in which a wall partitioning one process chamber into two process chambers is provided. In addition, the load lock chamber 6 and the joining chamber 7 may have a structure in which side surfaces of the load lock chamber 6 and the joining chamber 7 are in contact with each other without a gap therebetween. A gate 8 for transferring the support plate laminated wafer (laminate) 40 between the load lock chamber 6 and the joining chamber 7 is provided at a boundary between the load lock chamber 6 and the joining chamber 7. Opening and closing of the gate 8 are controlled by a shutter. In addition, a transfer window 9 that can be opened or closed for transferring the support plate 41, the wafer 42, and the support plate laminated wafer 40, between the bonding apparatus 2 and the external robot arm 4, is provided in the load lock chamber 6. Well-known decompression pumps (not illustrated) are provided respectively in the load lock chamber 6 and the joining chamber 7 and can independently control the internal pressures of the respective chambers.

Since the joining chamber 7 can be decompressed, the wafer 42 and the support plate 41 can be bonded to each other through an adhesive layer in a decompressed atmosphere. By compressing the wafer to the adhesive layer under the decompressed atmosphere, in a state in which the air does not exist in holes of uneven patterning on the surface of the wafer, the adhesive layer can be caused to enter the holes. Therefore, it is possible to more securely prevent the generation of bubbles between the adhesive layer and the wafer.

The gate 8 is formed such that the support plate laminated wafer 40 in which position matching is performed can be moved from the load lock chamber 6 to the joining chamber 7 in a state in which a shutter is opened, and the support plate laminated wafer 40 after joining can be moved from the joining chamber 7 to the load lock chamber 6. The gate 8 has a structure in which the support plate laminated wafer 40 before joining can be moved from the load lock chamber 6 to the joining chamber 7 under decompression by opening a shutter in a state in which both of the load lock chamber 6 and the joining chamber 7 is decompressed.

An internal robot arm (first robot arm) 10 that transfers the support plate laminated wafer 40 between the load lock chamber 6 and the joining chamber 7 through the gate 8 is further provided in the bonding apparatus 2. Details of the internal robot arm 10 are described below.

An overlapping mechanism that overlaps the wafer 42 and the support plate 41 prior to bonding the wafer 42 and the support plate 41 is arranged in the load lock chamber 6. In the support plate 41 that is carried in the load lock chamber 6 by the external robot arm 4, an adhesive layer is formed by the spinners 52 and the baking plates 51. In the load lock chamber 6, the wafer 42 and the support plate 41 are overlapped so as to interpose the adhesive layer. Details of the overlapping mechanism are described below.

In the joining chamber 7, a bonding mechanism for bonding the wafer 42 and support plate 41 (the support plate laminated wafer 40) which are overlapped to each other, is arranged. The wafer 42 and the support plate 41 are thermocompressed in the joining chamber 7. Details of the bonding mechanism are described below.

Here, according to the bonding apparatus 2 having the structure described above, an internal pressure state of the joining chamber 7 and an internal pressure state of the load lock chamber 6 can be independently controlled. That is, while the joining chamber 7 is caused to be a vacuum state all the time, the inside of the load lock chamber 6 can be caused to be a vacuum or at atmospheric pressure. Therefore, if atmospheric pressure is necessary to transfer the wafer 42, the support plate 41, and the support plate laminated wafer 40 between the bonding apparatus 2 and the external robot arm 4, it is possible to cause only the load lock chamber 6 to be at atmospheric pressure and cause the joining chamber 7 to be maintained in a vacuum state. In addition, when the support plate laminated wafer 40 is transferred between the load lock chamber 6 and the joining chamber 7, transferring can be performed in a state in which the joining chamber 7 is maintained to be in a vacuum state by opening the shutter of the gate 8 after the load lock chamber 6 is caused to be in a vacuum state. According to this, because the joining chamber 7 can be maintained to be a vacuum at all times, a temperature change in the pressing plate can be prevented, and thus a decrease in the accuracy of bonding can be prevented.

In addition, during the period from when the load lock chamber 6 is exposed to the atmosphere until when the load lock chamber 6 is caused to be back to a vacuum, the wafer 42 and the support plate 41 can be bonded (joined) in the joining chamber 7 in the vacuum. In contrast, in a configuration in which a bonding portion has to be exposed to the atmosphere in order to be carried to the next step of the support plate laminated wafer 40, a bonding process cannot be proceeded while the bonding portion is exposed to the atmosphere and is carried to the next step of the support plate laminated wafer 40. Therefore, the system 1 can reduce the entire process time compared with the configuration in which a bonding portion also has to be exposed to the atmosphere.

Specifically, when a case in which the bonding portion also has to be exposed to the atmosphere is used, the entire process time requires 3 minutes as another operation time in addition to the bonding time. Meanwhile, if the system 1 is used, another operation time in addition to the bonding time is 1 minute. That is, in a process time for one time of bonding process, 2 minutes can be reduced.

As the prealigner 3, for example, an adsorption apparatus disclosed in JP-A-2009-212196 (published on Sep. 17, 2009) can be used for aligning the support plate 41 and the wafer 42.

The external robot arm 4 can convey the support plate 41, the wafer 42, and the support plate laminated wafer 40, and perform transfer of the support plate 41, the wafer 42, and the support plate laminated wafer 40 to and from the bonding apparatus 2. The external robot arm 4 moves on the external robot arm track 5. The external robot arm 4 and the external robot arm track 5 that perform this function can be prepared by a technique well-known in the art.

The baking plates 51 are units for curing an adhesive layer coated on a wafer.

Internal Robot Arm

Figure 1:
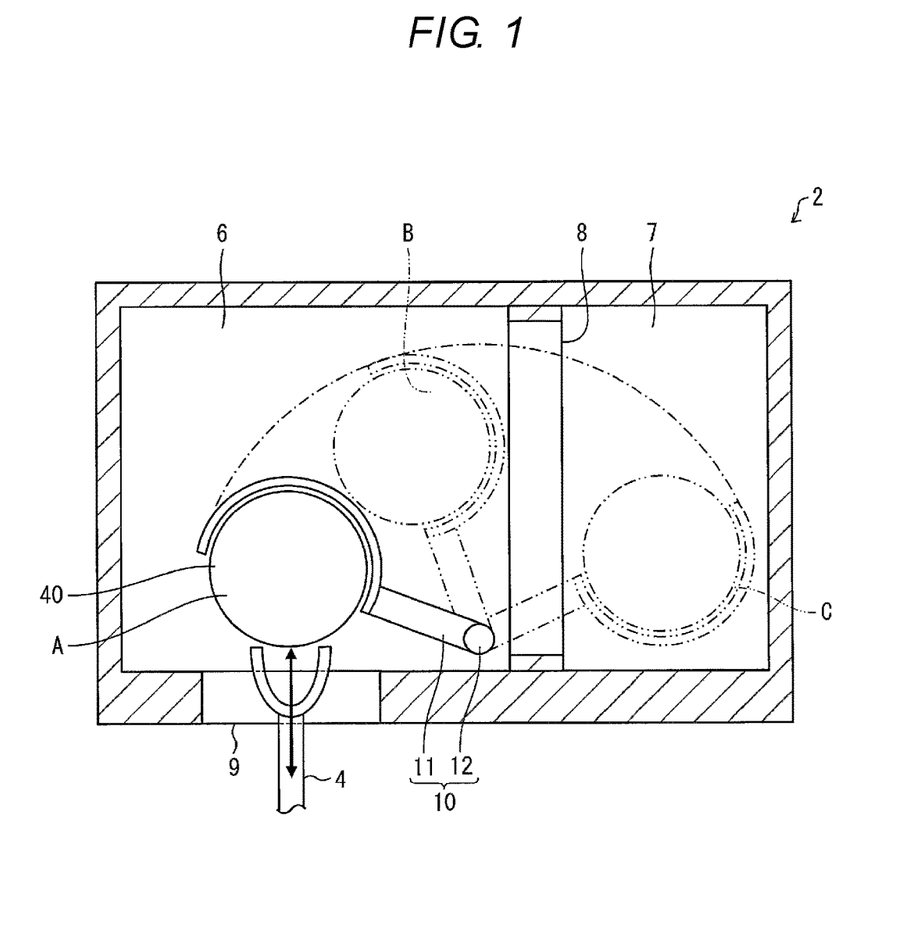
FIG. 1 is a diagram illustrating a configuration of a main portion of a bonding apparatus according to an embodiment of the invention seen from above.

The bonding apparatus 2 includes the internal robot arm 10 that moves the support plate laminated wafer 40 between the load lock chamber 6 and the joining chamber 7. FIG. 1 is a diagram illustrating an internal configuration of the bonding apparatus 2 including the internal robot arm 10 seen from the above. Specific mechanisms of the internal robot arm 10 are not particularly limited as long as the internal robot arm 10 can move the support plate laminated wafer 40 between the load lock chamber 6 and the joining chamber 7. According to the embodiment, as illustrated in FIG. 1, the internal robot arm 10 is formed with an arm 11 and an arm pivot 12. The internal robot arm 10 is a mechanism that moves the support plate laminated wafer 40 by rotation using the arm pivot 12 of the arm 11 that can support the support plate laminated wafer 40 from the lower surface thereof as a rotation center. Details thereof are described below, but, according to the embodiment, two internal robot arms 10 having a common rotation pivot are provided. The arm pivot 12 is provided on the load lock chamber 6 side, but may be provided on the joining chamber 7 side. Since it is possible to make a stroke of a transfer between the load lock chamber 6 and the external robot arm 4 short, the arm pivot 12 is preferably formed on a side close to the side surface on which the transfer window 9 is formed. In FIG. 1, a solid line indicated by "A" shows a position (load lock chamber transferring position) in the load lock chamber 6 of the arm 11, an alternating one long and two short dashed line indicated by "B" shows a waiting position of the arm 11, and an alternating one long and two short dashed line indicated by "C" shows a position (joining chamber transferring position) in the joining chamber 7 of the arm 11.

The rotation speed of the arm 11 can be set at a speed according to a circumstance. Therefore, when the arm 11 holds the support plate laminated wafer 40, the arm 11 can be caused to rotate at a low speed, and when the arm 11 does not hold the support plate laminated wafer 40, the arm 11 can be caused to rotate at a high speed. In addition, acceleration and deceleration can be controlled so as to smoothen a start and a stop of the rotation of the arm 11.

As illustrated in FIG. 1, the gate 8 is an opening with a width with which the rotating arm 11 passes through the gate 8 and conveys the support plate laminated wafer 40 to the joining chamber transferring position C in a state in which a shutter is open. In the opening and closing of the gate 8, a well-known method can be used, and, for example, a gate valve structure can be applied.

In addition, the internal robot arm 10 directly transfers the support plate laminated wafer 40 to the external robot arm 4, in a state in which the rotating arm 11 conveys the support plate laminated wafer 40 to a load lock chamber transferring position A. Accordingly, the transfer window 9 is provided such that the external robot arm 4 can be inserted to a position in which the support plate laminated wafer 40 of the load lock chamber transferring position A can be directly received.

Figure 3:
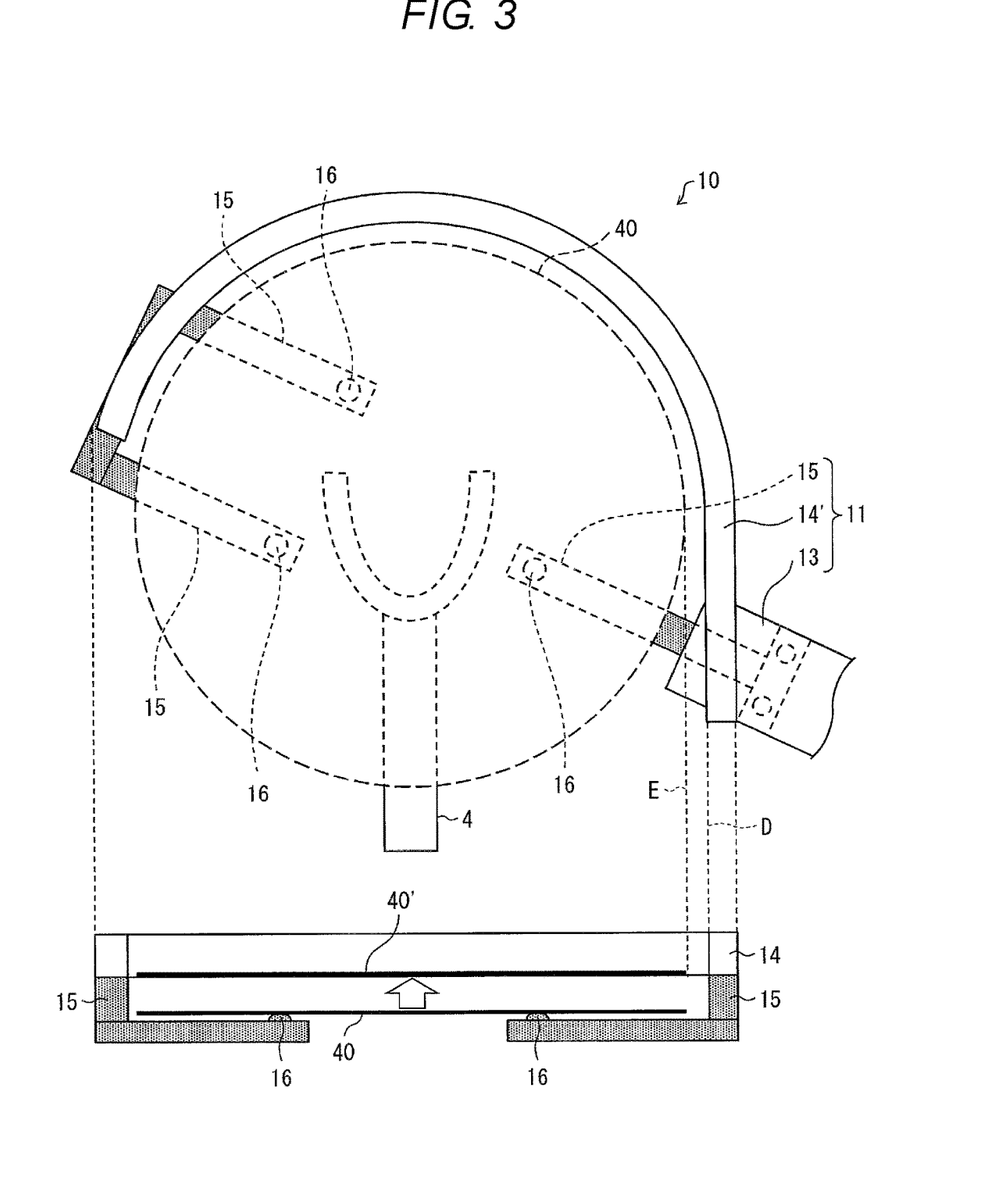
FIG. 3 is a diagram illustrating a configuration of a first robot arm of a bonding apparatus according to the embodiment of the invention, in which (a) is a top view and (b) is a side view.

FIG. 3 is a diagram illustrating the internal robot arm 10 in a state in which the support plate laminated wafer 40 is held, in which (a) is a diagram of the internal robot arm 10 seen from an upper surface and (b) is a diagram of the internal robot arm 10 seen from a side surface. As illustrated in FIG. 3, the arm 11 includes an arm boom 13, a hand frame portion (frame portion) 14 that is provided on a leading edge of the arm boom 13, and a hand nail portion (supporting member) 15.

According to the embodiment, the hand frame portion 14 has a shape like an arc and surrounds a portion of a circumference of the support plate laminated wafer 40 or the like in a state in which the internal robot arm 10 holds the support plate laminated wafer 40 and the like. However, the shape of the hand frame portion 14 is not limited thereto, and may be a polygonal shape or another shape.

The hand nail portion 15 is linked to a lower portion of the hand frame portion 14, and supports the support plate laminated wafer 40 from below. Deviation preventive members 16 for preventing deviation of the support plate laminated wafer 40 are formed in portions coming into contact with the support plate laminated wafer 40 and the like in the hand nail portion 15. The deviation preventive members 16 are preferably formed with a heat resistant material and more preferably have heat resistance up to 250° C. In addition, if deviation is not generated on the support plate laminated wafer 40 or the like even though a deviation preventive mechanism is not provided on the support plate laminated wafer 40, the deviation preventive members 16 and the like may not be provided.

According to the embodiment, as illustrated in FIG. 3, three deviation preventive members 16 equally support the support plate laminated wafer 40 and the like at three points. Accordingly, the support plate laminated wafer 40 and the like can be stably supported. However, the invention is not limited thereto, and, as long as the support plate laminated wafer 40 and the like are stably supported, the invention is not limited to a three-point support configuration.

In addition, the hand nail portion 15 is preferably stretched in a direction parallel to the arm boom 13. If the hand nail portion 15 is configured in this manner, the hand nail portion 15 can be prevented from coming into contact with the support plate laminated wafer 40, at the time of transferring the support plate laminated wafer 40 in the joining chamber 7.

Here, according to the invention, the internal robot arm 10 can directly transfer the support plate laminated wafer 40 to the external robot arm 4 in the load lock chamber 6. According to the embodiment, the hand frame portion 14 is configured to expose a side from which the external robot arm 4 extracts the support plate laminated wafer 40, on the circumference of the support plate laminated wafer 40. Accordingly, it is possible to directly transfer the support plate laminated wafer 40 from the internal robot arm 10 to the external robot arm 4 by causing the external robot arm 4 to extract the support plate laminated wafer 40 held by the internal robot arm 10 from a side which is not surrounded by the hand frame portion 14 on the circumference of the support plate laminated wafer 40.

This is described in detail with reference to FIG. 3. On the right side of FIG. 3 on the paper, a position E on the circumference of the support plate laminated wafer 40 held by the internal robot arm 10 exists on an inner side of a position D on an internal circumference of the hand frame portion 14. Therefore, even if the support plate laminated wafer 40 is moved toward the downward side of the paper, the support plate laminated wafer 40 is not caught by the hand frame portion 14. Accordingly, the external robot arm 4 can easily extract the support plate laminated wafer 40 by slightly raising the support plate laminated wafer 40 from the deviation preventive member 16 (at a position of 40') as presented on the lower side of FIG. 3 on the paper.

In addition, according to the embodiment, as described below, the bonding apparatus 2 includes two internal robot arms 10 provided on different positions, but the number of internal robot arm 10 is not particularly limited.

Modification Example of Internal Robot Arm

In addition, the hand frame portion 14 may not necessarily be configured to expose a side from which the external robot arm 4 extracts the support plate laminated wafer 40 on the circumference of the support plate laminated wafer 40.

Figure 4:
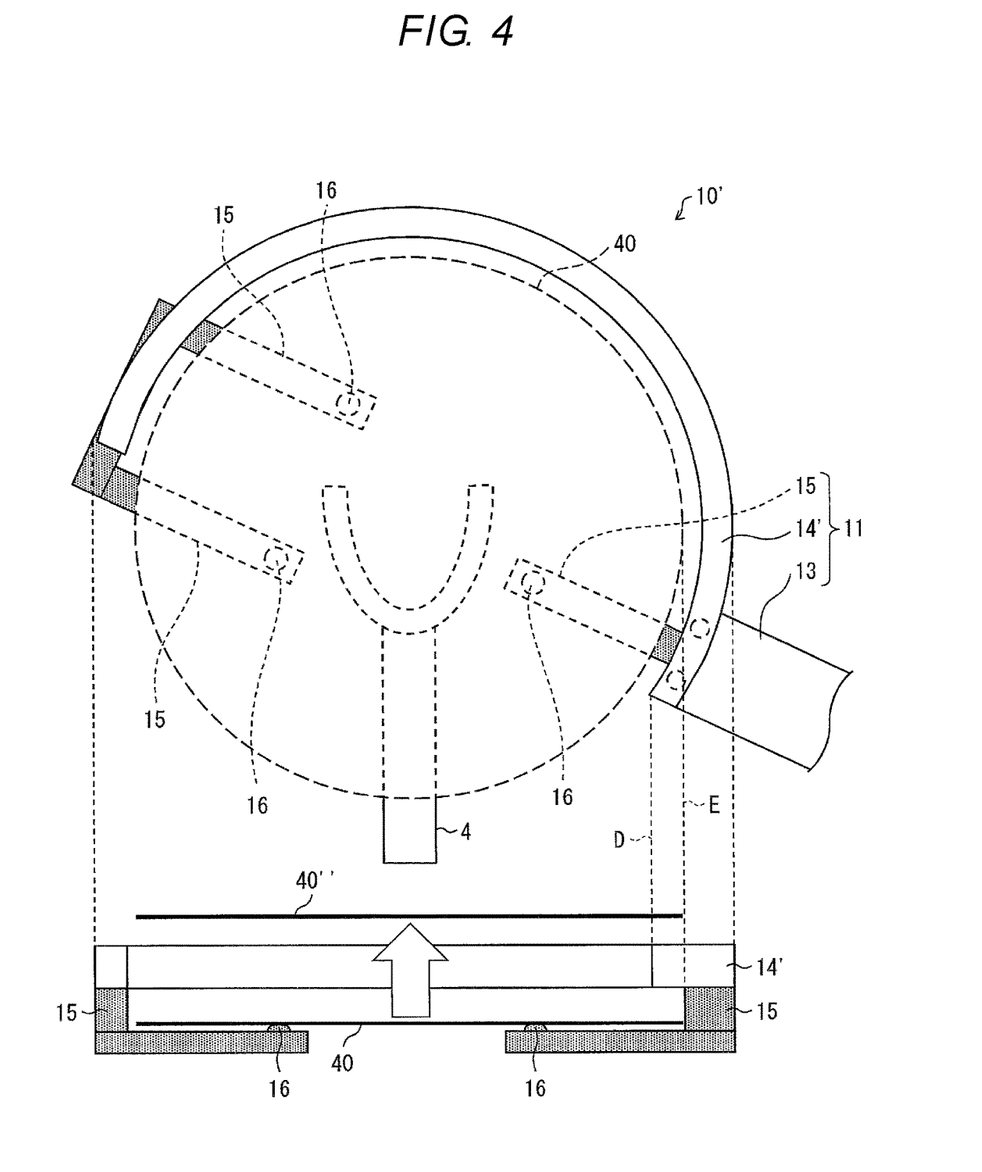
FIG. 4 is a diagram illustrating a configuration of a first robot arm of a bonding apparatus according to another embodiment of the invention, in which (a) is a top view and (b) is a side view.

For example, a configuration of the internal robot arm 10' according to the modification example of the embodiment is illustrated in FIG. 4. As illustrated on the right side of FIG. 4 on the paper, when the position E on the circumference of the support plate laminated wafer 40 held by the internal robot arm 10' exists on the outer side of the position D on an internal circumference of the hand frame portion 14', if the support plate laminated wafer 40 is moved toward the downward side of the paper, the support plate laminated wafer 40 is caught by the hand frame portion 14'. Even in this case, as illustrated on the lower side of FIG. 4 on the paper, the external robot arm 4 can easily extract the support plate laminated wafer 40 by raising the support plate laminated wafer 40 higher than the hand frame portion 14' (at a position of 40").

In this manner, if a mechanism holding the support plate laminated wafer 40 and the like in the internal robot arm 10 is configured with the hand frame portion 14 that surrounds a portion of the circumference of the support plate laminated wafer 40 and the hand nail portion 15 that supports the support plate laminated wafer 40 from below, it is possible to configure the internal robot arm 10 such that the support plate laminated wafer 40 can be directly transferred to the external robot arm 4.

Overlapping Mechanism

Figure 5:
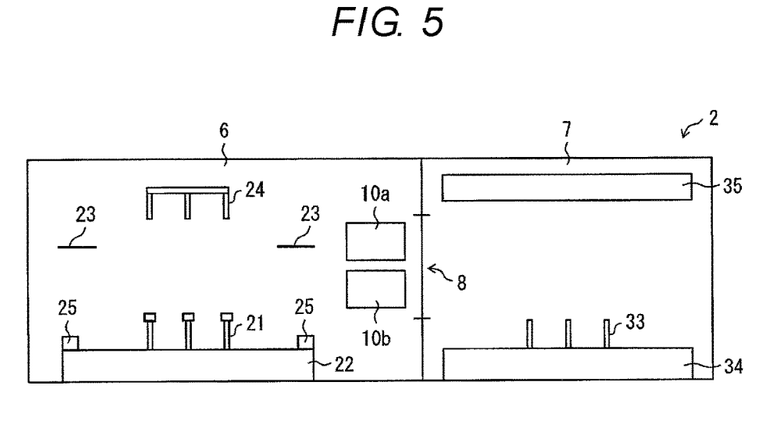
FIG. 5 is a diagram illustrating an internal configuration of a bonding apparatus according to the embodiment of the invention which is seen from a side.
Figure 6:
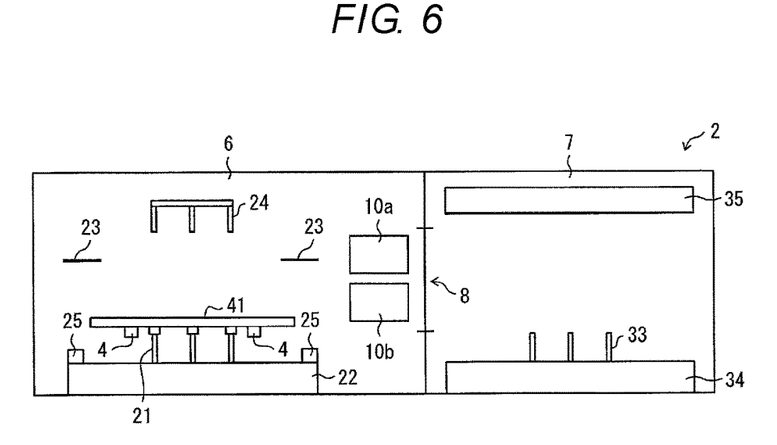
FIG. 6 is a diagram illustrating a state of respective configurations of the bonding apparatus in one step of a carrying method according to the embodiment of the invention.
Figure 7:
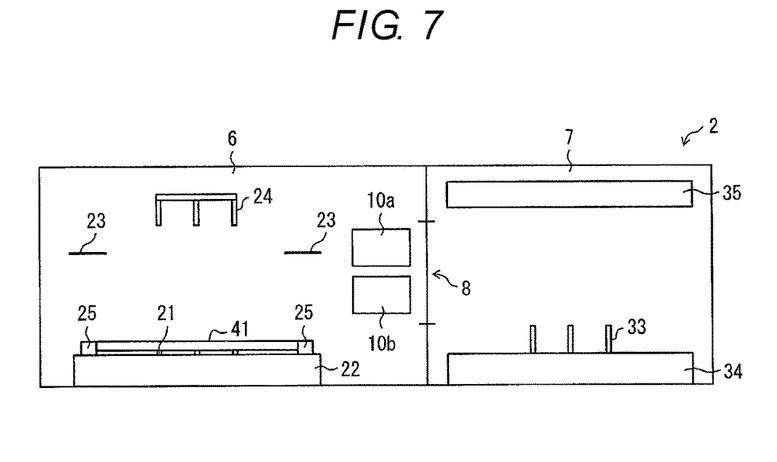
FIG. 7 is a diagram illustrating a state of the respective configurations of the bonding apparatus in one step of the carrying method according to the embodiment of the invention.
Figure 8:
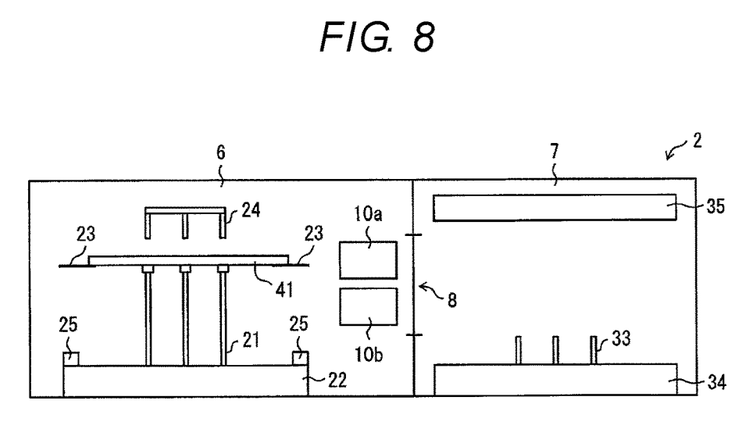
FIG. 8 is a diagram illustrating a state of the respective configurations of the bonding apparatus in one step of the carrying method according to the embodiment of the invention.
Figure 9:
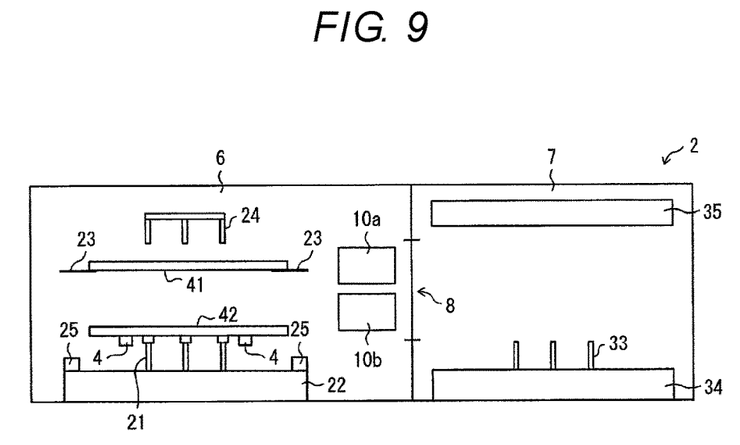
FIG. 9 is a diagram illustrating a state of the respective configurations of the bonding apparatus in one step of the carrying method according to the embodiment of the invention.

An overlapping mechanism that is provided in the load lock chamber 6 and overlaps the wafer 42 and the support plate 41 is described. FIG. 5 is a diagram illustrating specific configurations of an overlapping mechanism and a bonding mechanism according to the embodiment and illustrates the insides of the load lock chamber 6 and the joining chamber 7.

As illustrated in FIG. 5, the overlapping mechanism including a lift pin (supporting pin) 21 that can vertically move, a plate (heating portion) 22 including a heater, an external diameter matching mechanism 25 that can move in a horizontal direction, a spacer mechanism (holding member) 23 that can move in a horizontal direction, and a temporary pressing tool 24 is provided inside the load lock chamber 6. In addition, for convenience of description, respective members for maintaining and controlling the external diameter matching mechanism 25, the spacer mechanism 23, and the temporary pressing tool 24 are not illustrated in FIG. 5.

Plate

The plate 22 is a stand provided on a lower portion of the load lock chamber 6. The plate 22 includes a heater and the wafer 42 can be heated by this heater.

Lift Pin

The lift pin 21 is a rod-shaped member that is provided on the plate 22 and that can move up and down in a vertical direction. The lift pin 21 can hold the support plate 41 or the wafer 42 which is a target of overlapping or the support plate laminated wafer 40 in which these are overlapped, from the bottom, and, accordingly, the support plate 41, the wafer 42, and the support plate laminated wafer 40 which are held can be moved up and down in the vertical direction.

External Diameter Matching Mechanism

The external diameter matching mechanism 25 is a member that adjusts positions of the support plate 41 and the wafer 42, which are targets of position matching, in a horizontal direction, for position matching. As long as the positions of the support plate 41 and the wafer 42 in the horizontal direction can be appropriately adjusted, that is, as long as the support plate 41 and the wafer 42 can be moved in a desired horizontal position, specific mechanisms of the external diameter matching mechanism 25 are not particularly limited, and a well-known aligner can be used. In addition, according to the embodiment, for example, the external diameter matching mechanism 25 may be, but not limited to, an external diameter matching mechanism which includes an air cylinder, a stepping motor, and the like, moves respective members in a horizontal radiation direction, and press the support plate 41 or the wafer 42 to a desired position by switching from an "open state" in which respective members are separated from the support plate 41 or the wafer 42, to a "closed state" in which respective members are moved to directions in which respective members come to close to each other.

Spacer Mechanism

The spacer mechanism 23 is a member that holds the support plate 41 (the wafer 42, if external diameter matching of the wafer is performed beforehand) in which external diameter matching is performed without changing a horizontal position thereof, until temporary joining is performed. The spacer mechanism 23 stably holds the support plate 41 by supporting a portion of a periphery of the support plate 41 from a lower side thereof. The spacer mechanism 23 can move in the horizontal direction. If the support plate 41 is placed on the lift pin 21 and conveyed to a spacer insertion position, the spacer mechanism 23 is moved to a position where the spacer mechanism 23 does not overlap with the support plate 41 at all. In addition, after the support plate 41 is carried to the spacer insertion position, the spacer mechanism 23 is returned to a position where the spacer mechanism 23 overlaps with the support plate such that the support plate 41 can be supported by the spacer mechanism 23.

The material of the spacer mechanism 23 is not particularly limited, and, for example, stainless steel (SUS) or a material obtained by performing Teflon (registered trademark) coating and the like on stainless steel (SUS) can be used.

Temporary Pressing Tool

The temporary pressing tool 24 is a member that is paired with the lift pin 21 and interposes the support plate 41 and the wafer 42 therebetween and pressing the support plate 41 to the wafer 42 for temporary joining when the support plate 41 and the wafer 42 are overlapped, and thereby preventing positional deviation in the horizontal direction that may occur at the time of overlapping. The temporary pressing tool 24 is provided in a vertically upper side of the spacer mechanism 23. According to the embodiment, the temporary pressing tool 24 can vertically move.

Since the temporary pressing tool 24 comes into contact with the support plate 41, it is preferable to form the temporary pressing tool 24 with a material that can prevent the support plate 41 from being damaged, and, for example, the resin can be used. Among them, a fluororesin such as polytetrafluoroethylene is preferable. A shape of the temporary pressing tool 24 is not particularly limited, but according to the embodiment, as illustrated in FIG. 5, the temporary pressing tool 24 has a trifurcate structure pressing the support plate 41 at three points so as to correspond to the lift pin 21 which gives a three-point support. However, the invention is not limited thereto, and, for example, may have a columnar shape of which a contact surface with the support plate 41 is a circular shape.

In addition, except for the time when the support plate 41 and the wafer 42 are temporarily joined, the temporary pressing tool 24 waits in a waiting position in which the temporary pressing tool 24 is upwardly separated from the support plate 41, and when temporary joining is performed, the temporary pressing tool 24 descends and presses the support plate 41. In addition, according to the embodiment, a spring mechanism is provided at a leading edge (end on a side coming into contact with the support plate 41) of the temporary pressing tool 24, and the support plate 41 is pressed by the force of the spring. In addition, in substitution for the spring, other well-known elastic bodies may be used.

According to the overlapping mechanism having the configuration described above, a horizontal position of the support plate 41 mounted on the lift pin 21 can be adjusted by using the external diameter matching mechanism 25. In addition, after position adjustment of the support plate 41 is completed, the support plate 41 can be upwardly moved by using the lift pin 21 and can be held on the spacer mechanism 23 without changing a horizontal position thereof. Also, it is possible to place the wafer 42 on the lift pin 21 that is moved to a position slightly above the plate 22, using the external diameter matching mechanism 25, adjust the horizontal position of the wafer 42, and heat the wafer 42 by a heater provided in the plate 22. Also, by elevating the lift pin 21 as it is, the heated wafer 42 in which position matching is completed is conveyed to a position in which the support plate 41 is held without changing the horizontal position, the temporary pressing tool 24 and the lift pin 21 are paired with each other and interpose the support plate 41 and the wafer 42 therebetween, so as to temporarily join the support plate 41 and the wafer 42. Accordingly, when the spacer mechanism 23 is removed, it is possible to prevent the horizontal position of the support plate 41 from changing. Accordingly, with the configuration described above, the wafer 42 and the support plate 41 can be accurately overlapped.

The temperature of the heater provided in the plate 22 preferably satisfies the following conditions. In that case, the wafer 42 and the support plate 41 are temporarily joined successfully, deviation is appropriately prevented, and the lift pin 21 is preferably prevented from adhering to the support plate 41.

When the wafer 42 and the support plate 41 are overlapped, at least a portion of the wafer 42 and the support plate 41 can be fused by an adhesive layer.

At the time of "3. Spacer insertion and support plate transfer" described below, the lift pin 21 can be prevented from being heated to a temperature at which the lift pin 21 is fused to the adhesive layer formed on a surface on a lower side of the carried support plate 41.

That is, if the temperature of the heater decreases too much, at the time of overlapping and temporary joining, the wafer 42 is not sufficiently joined to the support plate 41 and slips. Meanwhile, if the temperature of the heater increases too high, the lift pin 21 adheres to the support plate 41. In this case, after the support plate 41 temporarily follows the movement of the lift pin 21, bouncing (vertical vibration) of the support plate 41 occurs as a reaction thereof.

The temperature of the heater that satisfies the condition described above can be determined, for example, by performing an experiment as described below. That is, while a preset temperature of the heater is changed, the presence or absence of bouncing and a bonding range at the time of temporary joining are examined, and a temperature at which bouncing is not present and an adhesion range becoming wide at the time of temporary joining may be determined (see a reference example described below).

In addition, the processing times of temporary joining and main joining can be reduced by warming a single body of the wafer 42. In addition, if heating is performed in a vacuum state before the wafer 42 and the support plate 41 are overlapped, it is possible to prevent gas from being generated thereafter.

Bonding Mechanism

A bonding mechanism that is provided in the joining chamber 7 and performs bonding between the wafer 42 and the support plate 41 is described. As illustrated in FIG. 5, an overlapping mechanism including a lift pin 33 that can vertically move, a pressing plate 34 including a heater, and a pressing plate 35 that is paired with the pressing plate 34 and interposes the support plate laminated wafer 40 therebetween in a vertical direction is provided inside of the joining chamber 7. In addition, for convenience of description, a member for maintaining or controlling the pressing plate 35 is not illustrated in FIG. 5.

The bonding mechanism according to the embodiment interposes the support plate laminated wafer 40 between a pair of the pressing plates 34 and 35 before joining and bonds the wafer 42 and the support plate 41 by thermocompression.

The support plate laminated wafer 40 overlapped in the load lock chamber 6 by the overlapping mechanism is carried to the joining chamber 7 by the internal robot arm 10 and bonded by the bonding mechanism. The bonded support plate laminated wafer 40 is carried to the load lock chamber 6 by the internal robot arm 10, is directly transferred from the internal robot arm 10 to the external robot arm 4 and is carried out to the outside. In this manner, it is possible to prevent a specific portion in the load lock chamber 6 from being heated and to prevent undesired softening of the adhesive layer for bonding the wafer 42 and the support plate 41 by directly transferring the support plate laminated wafer 40 from the internal robot arm 10 that carries the support plate laminated wafer 40 from the joining chamber 7 to the load lock chamber 6, to the external robot arm 4 that carries out the support plate laminated wafer 40 from the load lock chamber 6 to the outside.

2. Carrying Method

The carrying method according to the invention includes a first carrying step of carrying the substrate and the support which are overlapped, from the overlapping chamber in which overlapping between the substrate and the support is performed, to the bonding chamber in which bonding between the substrate and the support is performed, by a first robot arm, a second carrying step of carrying the bonded laminate from the bonding chamber to the overlapping chamber by the first robot arm, a transferring step of directly transferring the laminate carried to the overlapping chamber from the first robot arm to a second robot arm, and a carrying-out step of carrying-out the laminate transferred to the second robot arm from the overlapping chamber to the outside.

According to the embodiment, a case where the carrying method according to the invention is performed by using the system 1 described above is described.

FIGS. 6 to 15 are diagrams sequentially illustrating states of respective steps in the carrying method according to the embodiment and showing configurations inside the load lock chamber 6 and the joining chamber 7. In addition, for convenience of description, in the same manner as in FIG. 5, respective members for maintaining or controlling the spacer mechanism 23, the temporary pressing tool 24, the external diameter matching mechanism 25, and the pressing plate 35 are not illustrated. Hereinafter, with reference to FIGS. 6 to 15, respective steps in the carrying method according to the invention are sequentially described.

1. Carrying-In of Support Plate (Overlapping Step: Support Carrying-In Stage)

First, the lift pin 21 is elevated to an external robot arm transferring position corresponding to a position of the external robot arm 4 in the perpendicular direction. Also, the support plate 41 having an adhesive layer formed on a surface on a lower side thereof is carried in the inside of the load lock chamber 6 through the transfer window 9 by using the external robot arm 4 and mounted on the lift pin 21 (see FIG. 6).

2. Support Plate External Diameter Matching (Overlapping Step: Support Position Matching Stage)

Subsequently, the lift pin 21 on which the support plate 41 is placed is lowered to an external diameter matching position slightly above the plate 22 (for example, above from the surface of the plate 22 by about 10 mm). The external diameter matching mechanism 25 is closed in a state in which the lift pin 21 moves to the external diameter matching position, and the support plate 41 is mounted on the plate 22, the external diameter matching (alignment) of the support plate 41 is performed so as to adjust the position in the horizontal direction, and the support plate 41 is moved to an appropriate position (see FIG. 7). In this manner, it is possible to avoid the support plate 41 from being adhered to the plate 22 by performing external diameter matching on the lift pin 21.

3. Spacer Insertion and Transferring of Support Plate (Overlapping Step: Support Transferring Stage)

After the external diameter matching of the support plate 41 is completed, the external diameter matching mechanism 25 is returned to be in the open state. Subsequently, the lift pin 21 on which the support plate 41 completing external diameter matching is placed is elevated to a spacer insertion position corresponding to a position of the spacer mechanism 23 in the perpendicular direction. After the lift pin 21 is moved to the spacer insertion position, the spacer mechanism 23 is inserted under the support plate 41 (see FIG. 8). Accordingly, without changing a position of the support plate 41 completing the external diameter matching in the horizontal direction, the support plate 41 can be transferred and held to the spacer mechanism 23. At this point, the temporary pressing tool 24 waits at the waiting position on the upper side of the support plate 41.

4. Wafer Carrying-In (Overlapping Step: Substrate Carrying-In Stage)

After the spacer mechanism 23 is inserted under the support plate 41, the lift pin 21 is lowered and moved to the external robot arm transferring position. At this point, the support plate 41 completing the external diameter matching comes into a state of being supported by the spacer mechanism 23 without changing the position thereof in the horizontal direction. After the lift pin 21 is moved to the external robot arm transferring position, the wafer 42 is carried in the inside of the load lock chamber 6 through the transfer window 9 by using the external robot arm 4 and disposed on the lift pin 21 (see FIG. 9). After carrying the wafer 42 in the inside of the load lock chamber 6 is completed and the transfer window 9 is closed, decompression of the load lock chamber 6 starts. The decompression of the load lock chamber 6 may be performed such that a decompression state of the load lock chamber 6 and a decompression state of the joining chamber 7 become substantially the same when the temporary joining is completed. It is preferable that the decompression state is 10 Pa or lower.

5. Wafer External Diameter Matching (Overlapping Step: Substrate Position Matching Stage, Heating Stage)

After the wafer 42 is disposed, the lift pin 21 on which the wafer 42 is placed is lowered to the external diameter matching position. After the lift pin 21 is lowered to the external diameter matching position, the external diameter matching mechanism 25 is brought into a closed state, the external diameter matching of the wafer 42 is performed to adjust positions in the horizontal direction, and the wafer 42 is moved to an appropriate position (see FIG. 10, substrate position matching stage).

Figure 10:
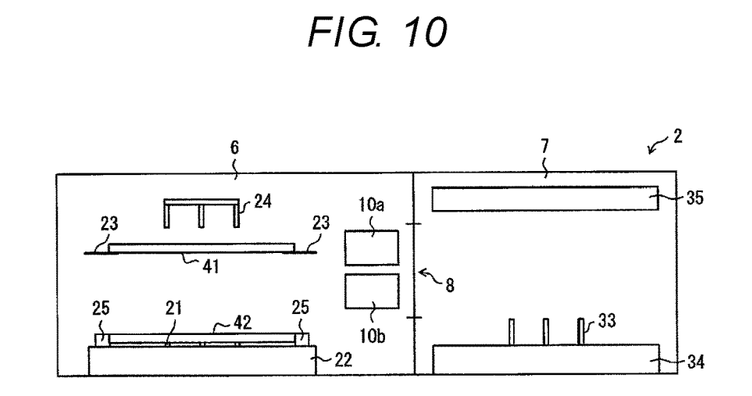
FIG. 10 is a diagram illustrating a state of the respective configurations of the bonding apparatus in one step of the carrying method according to the embodiment of the invention.
Figure 11:
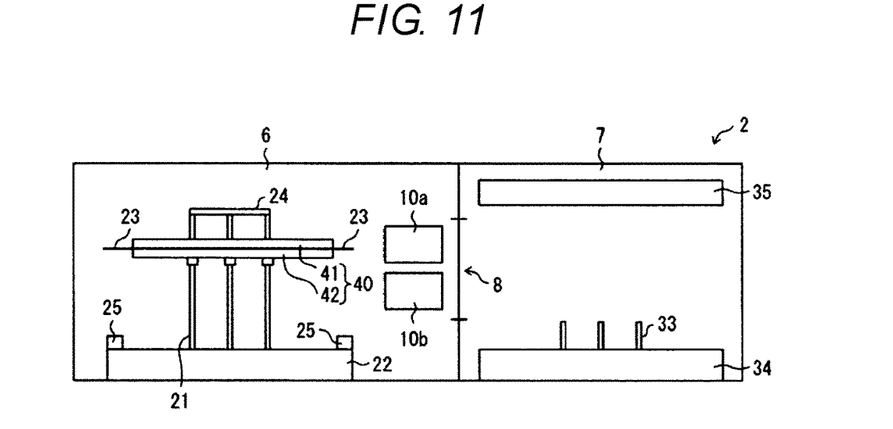
FIG. 11 is a diagram illustrating a state of the respective configurations of the bonding apparatus in one step of the carrying method according to the embodiment of the invention.
Figure 12:
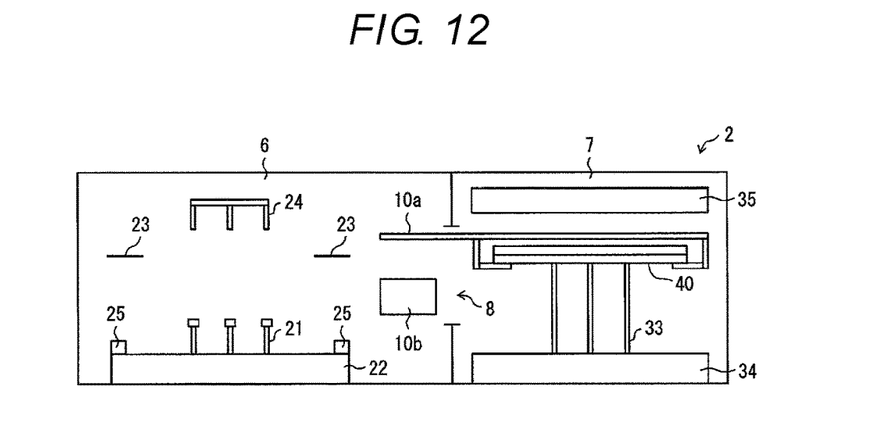
FIG. 12 is a diagram illustrating a state of the respective configurations of the bonding apparatus in one step of the carrying method according to the embodiment of the invention.
Figure 13:
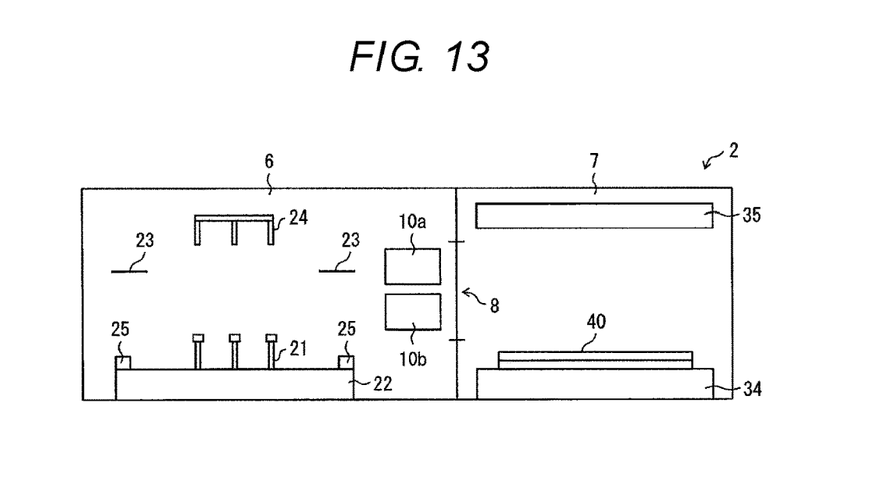
FIG. 13 is a diagram illustrating a state of the respective configurations of the bonding apparatus in one step of the carrying method according to the embodiment of the invention.

At this point, additionally, the wafer 42 on the lift pin 21 is heated (heating stage) by a heater provided in the plate 22. The temperature of the heater preferably satisfies the following conditions. In that case, the wafer 42 and the support plate 41 are temporary joined successfully, such that deviation is preferably avoided from occurring, and the lift pin 21 is preferably avoided from being struck to the support plate 41.

When the wafer 42 and the support plate 41 are overlapped, at least a portion of the wafer 42 and the support plate 41 can be fused by the adhesive layer.

At the time of "3. Spacer insertion and transferring of support plate", it is possible to suppress the lift pin 21 from being heated to a temperature at which the lift pin 21 is fused to the adhesive layer formed on the surface on the lower side of the carried support plate 41.

6. Temporary Joining (Overlapping Step: Overlapping Stage)

After the external diameter matching and the heating of the wafer 42 are completed, the external diameter matching mechanism 25 is returned to an open state. Subsequently, the lift pin 21 on which the wafer 42 completing the external diameter matching is placed is elevated to a temporary joining position corresponding to a position of the temporary pressing tool 24 in the vertical direction. Thereafter, the temporary pressing tool 24 is lowered and comes into contact with the support plate 41. Accordingly, the wafer 42 and the support plate 41 are overlapped to be the support plate laminated wafer 40 and the support plate laminated wafer 40 is interposed between the temporary pressing tool 24 and the lift pin 21 (see FIG. 11). At this point, since the wafer 42 is heated, the adhesive layer formed on the support plate 41 is partially softened, and the wafer 42 and the support plate 41 can be temporarily joined. Accordingly, a relative position between the support plate 41 and the wafer 42 in the horizontal direction can be prevented from being deviated. Thereafter, the spacer mechanism 23 is removed from between the wafer 42 and the support plate 41. In addition, the temporary pressing tool 24 retreats to a position that does not come into contact with the support plate 41 at times other than temporary joining.

7. Internal Carrying (First Carrying Step)

Subsequently, the support plate laminated wafer 40 is carried to the joining chamber 7 by an internal robot arm 10a. First, the internal robot arm 10a is moved to the load lock chamber transferring position, and the support plate laminated wafer 40 is held in the internal robot arm 10a. Also, the shutter of the gate 8 is opened, and the internal robot arm 10a is moved to the joining chamber transferring position. Also, the lift pin 33 is moved to the joining chamber transferring position, and the support plate laminated wafer 40 is supported by the lift pin 33 (see FIG. 12).

8. Main Joining: Preheating (Bonding Step: Preheating Stage)

Subsequently, the lift pin 33 is lowered to a plate mounted position on the same level as the pressing plate 34. Accordingly, the support plate laminated wafer 40 can be mounted on the pressing plate 34 (see FIG. 13). At this point, the support plate laminated wafer 40 is preheated by a heater provided in the pressing plate 34 for main joining.

9. Main Joining: Thermocompression (Bonding Step: Thermocompressing Stage)

Figure 14:
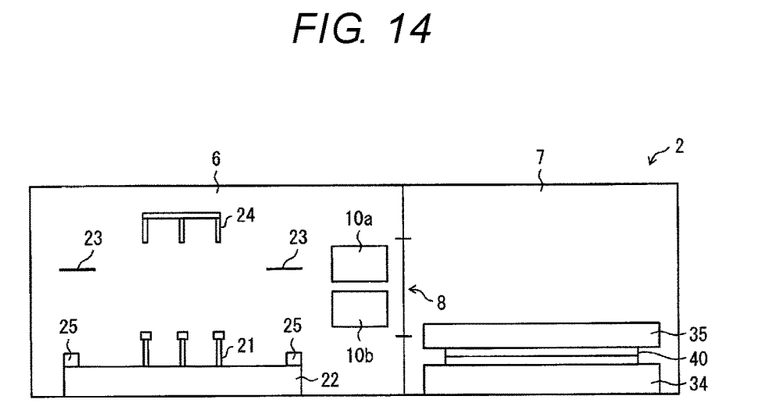
FIG. 14 is a diagram illustrating a state of the respective configurations of the bonding apparatus in one step of the carrying method according to the embodiment of the invention.

Also, the support plate laminated wafer 40 is interposed between the pressing plate 34 and the pressing plate 35 paired with each other and is thermocompressed (see FIG. 14). Accordingly, main joining between the wafer 42 and the support plate 41 is completed.

10. Transferring-Out of Support Plate Laminated Wafer (Second Carrying Step, Transferring Step, and Carrying-Out Step)

Subsequently, the main joined support plate laminated wafer 40 is carried to the load lock chamber 6 by an internal robot arm 10b (second carrying step), is directly transferred from the internal robot arm 10b to the external robot arm 4 (transferring step), and carried out to the outside of the bonding apparatus 2 by the external robot arm 4 (carrying-out step).

First, the internal robot arm 10b is moved to the joining chamber transferring position, and the support plate laminated wafer 40 is held on the internal robot arm 10b. Also, the shutter of the gate 8 is opened, the internal robot arm 10b is moved to the load lock chamber transferring position, and the shutter of the gate 8 is closed.

After the shutter of the gate 8 is closed, decompression of the load lock chamber 6 is released and the inside thereof is returned to be in atmospheric pressure. After the inside of the load lock chamber 6 is returned to be in atmospheric pressure, the transfer window 9 is opened, and the external robot arm 4 is inserted to the inside of the load lock chamber 6. Also, the support plate laminated wafer 40 held by the internal robot arm 10b is directly transferred to the external robot arm 4 (see FIG. 15).

Figure 15:
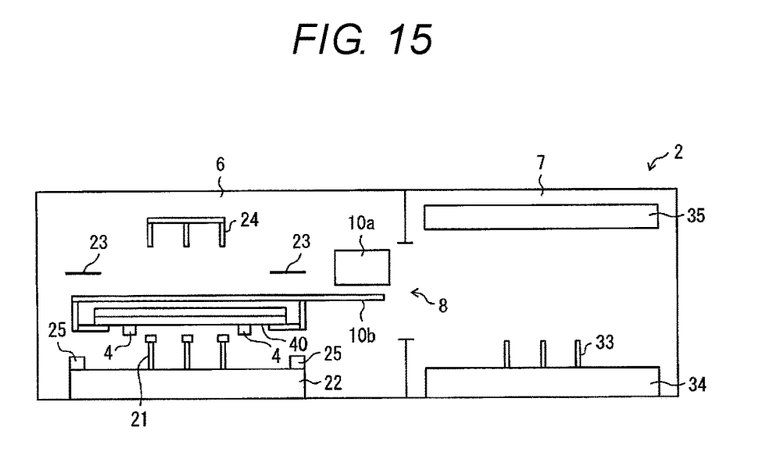
FIG. 15 is a diagram illustrating a state of the respective configurations of the bonding apparatus in one step of the carrying method according to the embodiment of the invention.

At this point, the internal robot arm 10b holds the support plate laminated wafer 40, in a state in which the hand frame portion 14 surrounds a portion of the circumference of the support plate laminated wafer 40 and the hand nail portion 15 supports the support plate laminated wafer 40 from below, and thus the support plate laminated wafer 40 is successfully transferred from the internal robot arm 10b to the external robot arm 4 by causing the external robot arm 4 to extract the support plate laminated wafer 40 from a side that is not surrounded by the hand frame portion 14 in the circumference of the support plate laminated wafer 40.

Also, the external robot arm 4 carries out the received support plate laminated wafer 40 to the outside of the bonding apparatus 2 through the transfer window 9. Accordingly, the carrying-out of the support plate laminated wafer 40 is completed.

Reference

Here, for reference, a case where a laminate is not directly transferred from a first robot arm that carries the laminate from a bonding chamber to an overlapping chamber to a second robot arm that carries out the laminate from the overlapping chamber to the outside is compared with the embodiment.

Specifically, the reference configuration is reviewed in which steps from "1. Importing of support plate" to "9. Main joining: thermocompression" described above are performed in the same manner as in the embodiment, and in a step of "10. Transferring-out of support plate laminated wafer", the support plate laminated wafer 40 held by the internal robot arm 10b is not directly transferred to the external robot arm 4 but is once mounted on the lift pin 21 (see FIG. 16), and the external robot arm 4 receives the support plate laminated wafer 40 on the lift pin 21 and carries out the support plate laminated wafer 40 to the outside.

Figure 16:
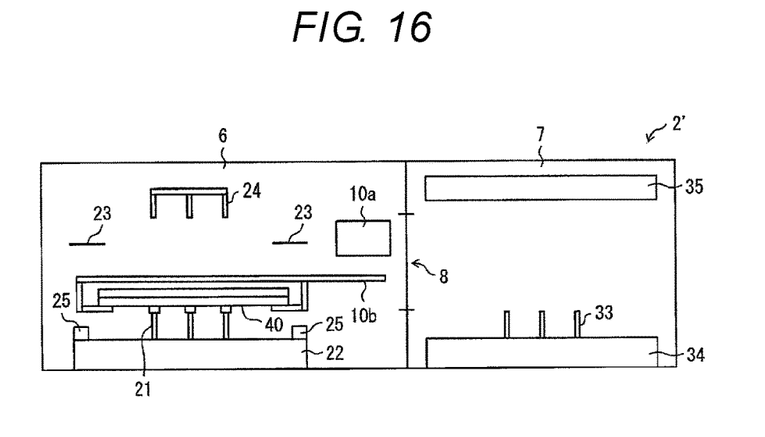
FIG. 16 is a diagram illustrating a state of the respective configurations of the bonding apparatus in one step of a carrying method as a reference.

In this field, direct transfer of a carried product between robot arms is not generally performed, and as described in the reference configuration, a configuration in which the first robot arm once mounts the carried product on a lift pin or the like and then the second robot arm picks up the carried product is general. However, as described above, since main joining between the wafer 42 and the support plate 41 is performed by thermocompression, the support plate laminated wafer 40 carried from the joining chamber 7 is hot. Therefore, if the support plate laminated wafer 40 carried from the joining chamber 7 is mounted on the lift pin 21, the lift pin 21 is heated.

In this state, as described in "1. Importing of support plate", if the support plate 41 for performing new overlapping is carried in the load lock chamber 6, the adhesive layer formed on the lower surface of the support plate 41 is heated by the lift pin 21 to be softened, and the support plate 41 and the lift pin 21 are adhered.

Figure 17:
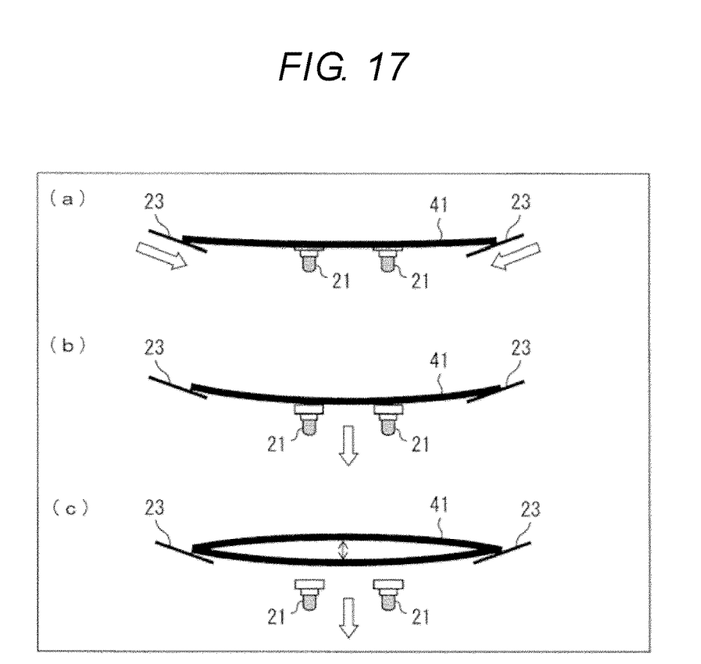
FIG. 17 is a diagram illustrating a problem in which a support and a supporting pin are adhered in the carrying method as a reference.

In this state, as described in "3. Spacer insertion and transferring of support plate" and "4. Wafer carrying-in", if the support plate 41 is transferred to the spacer mechanism 23 (see FIG. 17A), and then the lift pin 21 is lowered, the support plate 41 temporarily follows the lowering of the lift pin 21 (see FIG. 17B), and then the support plate 41 causes bouncing (vertical vibration) by reaction (see FIG. 17C).

In this manner, in a reference configuration in which the support plate laminated wafer 40 held by the internal robot arm 10b is not directly transferred to the external robot arm 4, but is once mounted on the lift pin 21, the lift pin 21 is heated by the support plate laminated wafer 40 carried from the joining chamber 7, the adhesive layer is unintentionally softened on the support plate 41 that comes into contact with the lift pin 21, and resultantly there is a concern that a phenomenon such as bouncing of the support plate 41 as described above occurs.

On the contrary, according to the embodiment, the support plate laminated wafer 40 held by the internal robot arm 10b is directly transferred to the external robot arm 4, thereby it is possible to prevent the lift pin 21 from being heated, and, accordingly, it is possible to successfully prevent the adhesive layer from being softened unintentionally in the support plate 41 that comes into contact with the lift pin 21 and the support plate 41 from bouncing as described above. In addition, contamination caused by the attachment of the softened adhesive agent to the lift pin 21 can be prevented.

The invention is not limited to the embodiment of the invention and various kinds of modifications are possible in the scope described in claims. That is, embodiments that can be obtained by combining technical means that can be changed in the scope described in the claims are included in the technical scope.

EXAMPLES

In the following conditions, 10 sets of wafers and support plates were sequentially bonded.

Apparatus: system 1 described above
Wafer: bare wafer
Support plate: glass substrate (diameter: 300 mm, thickness: 0.7 mm)
Adhesive agent: TZNR (registered trademark)-A3007
Baking temperature and time of adhesive agent: (i) 100° C. for 5 minutes, (ii) 160° C. for 5 minutes, (iii) 220° C. for 3 minutes
Heating in load lock chamber: to wafer only, in atmospheric pressure, 100° C. for 1 minute
The support plate laminated wafer 40 was directly transferred from the internal robot arm 10 to the external robot arm 4

As a result, in all sets, favorable main joining was able to be performed. In addition, bouncing was not seen in any set. In addition, a trace of a foreign material, an adhesive agent, or the like was seen in the lift pin 21 and the spacer mechanism 23, but it was not problematic.

Reference Example

Figure 18:
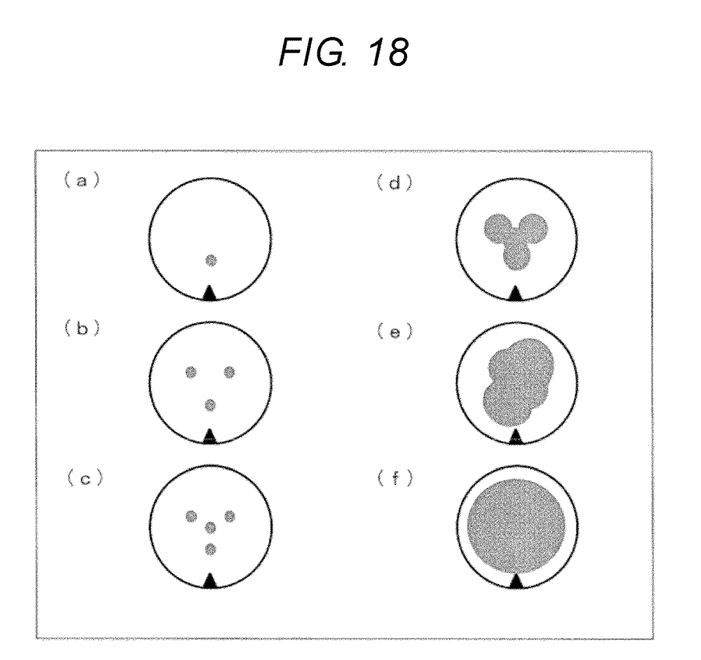
FIG. 18 is a diagram illustrating an examination result for optimizing the temperature of a supporting pin.

In order to determine an optimum value of a temperature of a heater in the plate 22 of the load lock chamber 6, the following tests were performed. That is, while a setting temperature of the heater was changed, the presence or absence of bouncing and an adhesion range at the time of temporary joining were examined. As the adhesive agent, the same adhesive agent as that used in the examples above was used. The results are presented in Table 1. As presented in Table 1, the optimum values of the set temperature of the heater were about 100° C.

TABLE 1

| Set temperature of heater | Temperature of lift pin | Presence of bouncing | Adhesion range at the time of temporary joining |
|---|---|---|---|
| 28° C. | 27.1° C. | None | FIG. 18A |
| 50° C. | 38.6° C. | None | FIG. 18B |
| 75° C. | 51.0° C. | None | FIG. 18C |
| 100° C. | 65.0° C. | None | FIG. 18D |
| 125° C. | 78.5° C. | Slightly present | FIG. 18E |
| 150° C. | 91.2° C. | Present | FIG. 18F |

In addition, in the same manner as the reference configuration illustrated in FIG. 16, when the support plate laminated wafer 40 after main joining in the joining chamber 7 was mounted on the lift pin 21 in the load lock chamber 6, even after the support plate laminated wafer 40 was carried out, the temperature of the lift pin 21 was 110° C. Therefore, it is clear that bouncing occurs in the reference configuration.

INDUSTRIAL APPLICABILITY

The invention can be used in performing the process accompanied by bonding between the substrate and the supporting plate and an apparatus therefor.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A carrying method comprising:
   a support carrying-in stage of carrying a support having an adhesive layer formed on a surface on a lower side thereof in an overlapping chamber;
   a support transferring stage of supporting from below and upwardly moving the support carried in the overlapping chamber by a supporting pin that can move in a vertical direction, and transferring the support to a holding member for holding the support;
   a substrate carrying-in stage of carrying a substrate in the overlapping chamber after the support transferring stage;
   a heating stage of supporting and downwardly moving the substrate by the supporting pin, and heating the substrate by a heating portion provided on a lower portion of the overlapping chamber;
   an overlapping stage of overlapping the substrate and the support after the heating stage;
   a first carrying step of carrying the substrate and the support which are overlapped from the overlapping chamber in which overlapping between the substrate and the support is performed to a bonding chamber in which bonding between the substrate and the support is performed by a first robot arm;
   a second carrying step of carrying a bonded laminate from the bonding chamber to the overlapping chamber by the first robot arm;
   a transferring step of directly transferring the laminate carried by the first robot arm to the overlapping chamber, the overlapping chamber including the supporting pin, from the first robot arm to a second robot arm; and
   a carrying-out step of carrying-out the laminate transferred to the second robot arm, from the overlapping chamber to the outside.

2. The carrying method according to claim 1, wherein the first robot arm includes a frame portion and a supporting member,
   the laminate is carried by the first robot arm in a state in which the frame portion surrounds a portion of a circumference of the laminate and the supporting member supports the laminate from below, and
   the laminate held by the first robot arm is extracted from a side which is not surrounded by the frame portion in the circumference of the laminate by the second robot arm.

3. The carrying method according to claim 1, further comprising bonding the substrate and the support which are overlapped in the bonding chamber after carrying the substrate and the support which are overlapped from the overlapping chamber, and before carrying the bonded laminate from the bonding chamber to the overlapping chamber by the first robot arm.

4. The carrying method according to claim 1, wherein a heating temperature of the heating portion is a temperature at which at least a portion of the substrate and the support is fused by the adhesive layer in the overlapping, and a temperature at which heating of the supporting pin to a temperature at which the supporting pin is fused to the adhesive layer formed on a surface on the lower side of the carried support is prevented in the support transferring stage.

* * * * *